(12) United States Patent
Margavio et al.

(10) Patent No.: US 11,943,845 B2
(45) Date of Patent: Mar. 26, 2024

(54) CERAMIC HEATER AND METHOD OF FORMING USING TRANSIENT LIQUID PHASE BONDING

(71) Applicant: Watlow Electric Manufacturing Company, St. Louis, MO (US)

(72) Inventors: Patrick Margavio, Columbia, MO (US); Todd Brooke, Columbia, MO (US); Kurt English, Columbia, MO (US)

(73) Assignee: WATLOW ELECTRIC MANUFACTURING COMPANY, St. Louis, MO (US)

(*) Notice: Subject to any disclaimer, the term of this patent is extended or adjusted under 35 U.S.C. 154(b) by 471 days.

(21) Appl. No.: 17/020,063

(22) Filed: Sep. 14, 2020

(65) Prior Publication Data

US 2021/0084719 A1 Mar. 18, 2021

Related U.S. Application Data

(60) Provisional application No. 62/899,189, filed on Sep. 12, 2019.

(51) Int. Cl.
*H05B 3/28* (2006.01)
*B23K 20/02* (2006.01)
(Continued)

(52) U.S. Cl.
CPC ........... *H05B 3/283* (2013.01); *C04B 35/581* (2013.01); *C04B 37/023* (2013.01);
(Continued)

(58) Field of Classification Search
CPC .............. B23K 20/02; B23K 2101/40; B23K 2103/10; B23K 2103/18; C04B 35/581;
(Continued)

(56) References Cited

U.S. PATENT DOCUMENTS 6,511,759 B1 1/2003 Schalansky
9,340,462 B2 5/2016 Harris et al.
(Continued)

FOREIGN PATENT DOCUMENTS

CN 1308259 C 4/2007
CN 100484366 C 4/2009
(Continued)

OTHER PUBLICATIONS

International Search Report issued in International Application PCT/US2020/050678, dated Dec. 1, 2020.
(Continued)

*Primary Examiner* — Dana Ross
*Assistant Examiner* — James F Sims, III
(74) *Attorney, Agent, or Firm* — Burris Law, PLLC

(57) ABSTRACT

A heater includes an aluminum nitride (AlN) substrate and a heating layer. The heating layer is made from a molybdenum material and is bonded to the AlN substrate via transient liquid phase bonding. The heater can also include a routing layer and a plurality of first conductive vias connecting the heating layer to the routing layer. The routing layer and the plurality of first conductive vias can be made from the molybdenum material and at least one of the routing layer and the plurality of first conductive vias are bonded to the AlN substrate via a transient liquid phase bond. A plurality of second conductive vias connecting the routing layer to a surface of the AlN substrate can be included and the plurality of second conductive vias are made of the molybdenum material and can be bonded to the AlN substrate via a transient liquid phase bond.

21 Claims, 6 Drawing Sheets

(51) Int. Cl.
    *B23K 101/40*      (2006.01)
    *B23K 103/10*      (2006.01)
    *B23K 103/18*      (2006.01)
    *C04B 35/581*      (2006.01)
    *C04B 37/02*      (2006.01)
    *H01L 21/67*      (2006.01)
    *H05B 1/02*      (2006.01)
    *H05B 3/12*      (2006.01)

(52) U.S. Cl.
CPC ............ *H05B 1/0233* (2013.01); *H05B 3/12* (2013.01); *B23K 20/02* (2013.01); *B23K 2101/40* (2018.08); *B23K 2103/10* (2018.08); *B23K 2103/18* (2018.08); *C04B 2237/122* (2013.01); *C04B 2237/16* (2013.01); *C04B 2237/366* (2013.01); *C04B 2237/62* (2013.01); *H01L 21/67103* (2013.01); *H05B 2203/005* (2013.01); *H05B 2203/016* (2013.01); *H05B 2203/017* (2013.01)

(58) Field of Classification Search
CPC ............ C04B 37/023; C04B 2237/122; C04B 2237/16; C04B 2237/366; C04B 2237/62; H05B 1/0233; H05B 3/12; H05B 3/03; H01L 21/67103; H01L 21/68757

See application file for complete search history.

(56) References Cited

U.S. PATENT DOCUMENTS

| | | | |
|---|---|---|---|
| 2003/0066587 A1* | 4/2003 | Yushio | C04B 35/6263 156/89.15 |
| 2012/0267149 A1* | 10/2012 | Oi | C04B 35/645 29/846 |
| 2013/0319762 A1* | 12/2013 | Harris | H01L 21/67248 156/60 |
| 2015/0008253 A1* | 1/2015 | Yoon | H01L 24/83 228/179.1 |
| 2017/0295612 A1* | 10/2017 | Smith | H05B 3/283 |
| 2018/0084650 A1* | 3/2018 | Iwazaki | C04B 35/645 |

FOREIGN PATENT DOCUMENTS

| | | |
|---|---|---|
| EP | 1581035 A2 | 9/2005 |
| TW | 200304909 A | 10/2003 |
| TW | I321127 B | 3/2010 |
| TW | I533363 B | 5/2016 |
| TW | I670312 B | 9/2019 |
| WO | 2013130918 | 9/2013 |

OTHER PUBLICATIONS

Search Report Issued in corresponding Taiwan Application No. 109131570 dated Dec. 2, 2021, 1 page.

Official Letter Appended with Search Report Issued in corresponding Taiwan Application No. 111142751 dated Aug. 14, 2023,, including English Translation, 11 pages.

* cited by examiner

Step 206

Step 208

Step 210

Step 212

CERAMIC HEATER AND METHOD OF FORMING USING TRANSIENT LIQUID PHASE BONDING

CROSS-REFERENCE TO RELATED APPLICATIONS

This application claims priority to U.S. provisional application No. 62/899,189 filed on Sep. 12, 2019. The disclosure of the above application is incorporated herein by reference.

FIELD

The present disclosure relates to resistive heaters, and more particularly to ceramic heaters having a resistive heating element with a ceramic substrate.

BACKGROUND

The statements in this section merely provide background information related to the present disclosure and may not constitute prior art.

A typical ceramic heater generally includes a ceramic substrate and a resistive heating element embedded within or disposed on the ceramic substrate. Heat generated by the resistive heating element can be rapidly transferred to a heating target disposed proximate the ceramic substrate because of excellent heat conductivity of ceramic materials. However, bonding ceramic materials to metallic materials is known to be difficult due to poor wettability of ceramic materials. Also, bonding between the ceramic substrate and the resistive heating element may be worse when the coefficient of thermal expansion (CTE) of the resistive heating element is incompatible with the CTE of the ceramic substrate. That is, cracks or air gaps may be generated at the interface between the ceramic substrate and the resistive heating element, thereby adversely affecting the heat transfer from the resistive heating element through the ceramic material to the heating target.

These issues with forming a resistive heating element with a ceramic substrate, among other issues related to the manufacture of ceramic heaters, are addressed by the present disclosure.

SUMMARY

This section provides a general summary of the disclosure and is not a comprehensive disclosure of its full scope or all of its features.

In one form of the present disclosure, a heater is provided. The heater comprises an aluminum nitride (AlN) substrate and a heating layer. The heating layer is made from a molybdenum (Mo) material and is bonded to the AlN substrate via transient liquid phase bonding.

In another form of the present disclosure, the heater further comprises a routing layer, and a plurality of first conductive vias connecting the heating layer to the routing layer. In some forms of the present disclosure, the routing layer and the plurality of first conductive vias are made from the molybdenum material. In such forms, at least one of the routing layer and the plurality of first conductive vias are bonded to the AlN substrate via transient liquid phase bonding.

In at least one form of the present disclosure, the heater further comprises a plurality of second conductive vias connecting the routing layer to a surface of the AlN substrate. In some variations, the plurality of second conductive vias are made of the molybdenum material and may be bonded to the AlN substrate via transient liquid phase bonding.

In one form of the present disclosure, the AlN substrate includes a plurality of plate members that are bonded together with the heating layer and the routing layer via transient liquid phase bonding. In some forms, the plurality of plate members includes a first plate member and a second plate member through which a plurality of first conductive vias made of the molybdenum material extend. In such variations, the heating layer is embedded within the first plate member and/or the second plate member. Also, an average surface roughness between the first plate member and the second plate member can be less than 5 μm. In one form of the present disclosure, a third plate member is included, and the routing layer made of the molybdenum material is embedded within the second plate member and/or a third plate member and is in electrical contact with the plurality of first conductive vias.

In at least one form of the present disclosure, the plurality of plate members includes a first plate member, a second plate member through which a plurality of first conductive vias made of the molybdenum material extend, and a third plate member through which a plurality of second conductive vias made of the molybdenum material extend. The heating layer is embedded within the first plate member and/or the second plate member.

Numerous forms of the present disclosure further comprise at least one of a termination layer made of the molybdenum material.

In another form of the present disclosure, a heater includes an AlN substrate comprising a plurality of plate members and a heating layer made from a molybdenum material disposed in the AlN substrate. The plurality of plate members are bonded together via one or more transient liquid phase bonds between the plurality of plate members. In some forms, the molybdenum material comprises molybdenum and silicon. In such aspects the transient liquid phase bond can include a molybdenum-silicon (Mo—Si) alloy and/or a Mo—Si intermetallic.

In at least one form of the present disclosure, the heater includes a routing layer and a plurality of first conductive vias connecting the heating layer to the routing layer. The routing layer and the plurality of first conductive vias are made from the molybdenum material and at least one of the routing layer and the plurality of first conductive vias are bonded to the AlN substrate via a transient liquid phase bond. The plurality of plate members can include a first plate member, a second plate member through which a plurality of first conductive vias made of the molybdenum material extend, and a third plate member through which a plurality of second conductive vias made of the molybdenum material extend. The heating layer is embedded within the first plate member and/or the second plate member and is bonded to the first plate member via a transient liquid phase bond. The routing layer is embedded within the second plate member and/or the third plate member and is bonded to the third plate member via transient liquid phase bonding.

In yet another form of the present disclosure, a method of forming a heater is provided. The method comprises transient liquid phase bonding a heating layer made from a molybdenum material to an AlN substrate. The transient liquid phase bonding includes heating the AlN substrate and the heating layer to a temperature above 1400° C. For example, in some forms the molybdenum material includes molybdenum and silicon and the heat layer and the AlN substrate are heated to above 1400° C. such that the silicon melts and diffuses into the heating layer and the AlN substrate to from a transient liquid phase bond therebetween. In such aspects a molybdenum intermetallic can be formed when the silicon diffuses into the heating layer. For example, a Mo—Si alloy and/or a Mo—Si intermetallic can be formed when the silicon diffuses into the heating layer.

In another form of the present disclosure, the method includes transient liquid phase bonding a routing layer made from the molybdenum material to the AlN substrate. In such a form, a plurality of first conductive vias can be disposed within the AlN substrate and connect the heating layer to the routing layer. Also, the method can include disposing a plurality of second conductive vias within the AlN substrate and the plurality of vias can connect the routing layer an external surface of the AlN substrate.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which:

FIG. 1 is a cross-sectional view of a ceramic heater constructed in accordance with the teachings of the present disclosure;

FIGS. 2A-2I depict a series of steps for a method of manufacturing a ceramic heater in accordance with the teachings of the present disclosure where: FIG. 2A is cross-sectional view of a second plate member; FIG. 2B is the second plate member in FIG. 2A with trenches and via; FIG. 2C is the second plate member in FIG. 2B with a molybdenum layer deposited on outer surfaces and within the trenches of the second plate member; FIG. 2D is the second plate member in FIG. 2C with the molybdenum layer removed from the outer surfaces of the second plate member; FIG. 2E is the second plate member in FIG. 2D with a silicon layer deposited on outer surfaces and on the molybdenum layer within the trenches of the second plate member; FIG. 2F is the second plate member in FIG. 2E with the silicon layer removed from the outer surfaces of the second plate member; FIG. 2G is the second plate member in FIG. 2F with a fastener disposed in the via of the second plate member; FIG. 2H is a cross-sectional view of a first plate member, the second plate member in FIG. 2G and a third plate member; and FIG. 2I is an assembly of the first plate member, the second plate member and the third plate member in FIG. 2H prior to transient liquid phase bonding of the plate members together;

Figure 1:
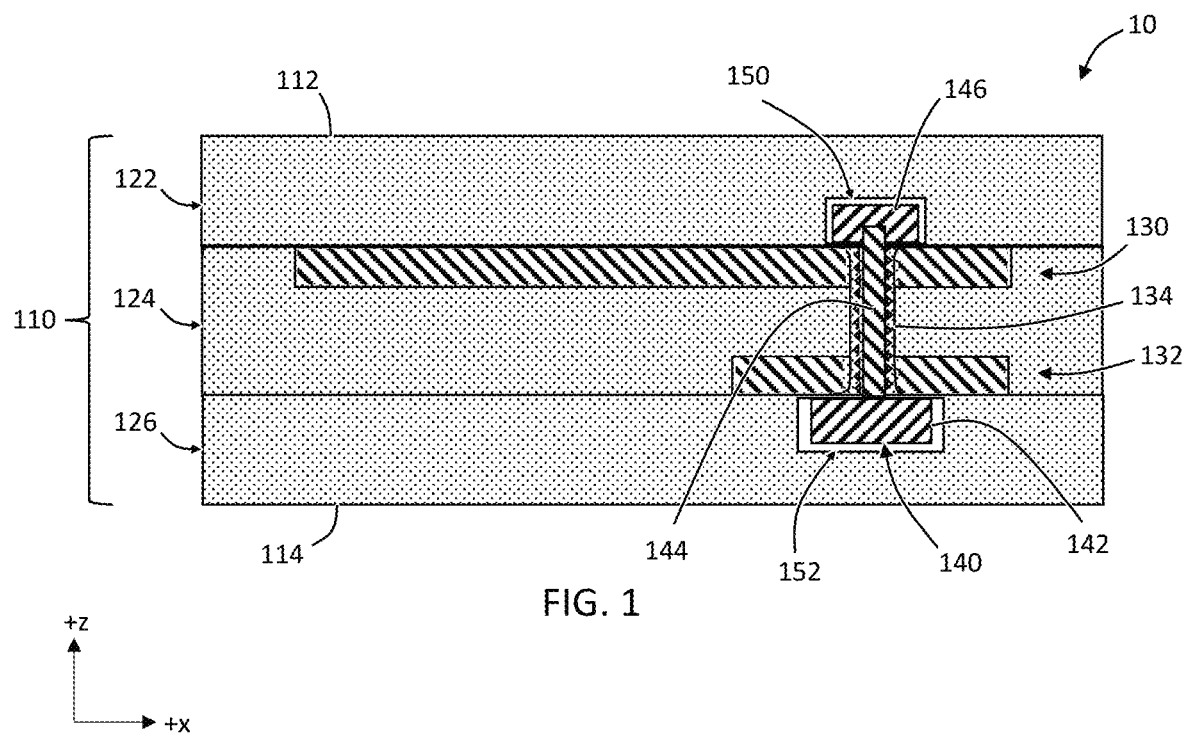

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features. Examples are provided to fully convey the scope of the disclosure to those who are skilled in the art. Numerous specific details are set forth such as types of specific components, devices, and methods, to provide a thorough understanding of variations of the present disclosure. It will be apparent to those skilled in the art that specific details need not be employed and that the examples provided herein, may include alternative embodiments and are not intended to limit the scope of the disclosure. In some examples, well-known processes, well-known device structures, and well-known technologies are not described in detail.

Referring to FIG. 1, a ceramic heater 10 constructed in accordance with the teachings of the present disclosure is shown. In one form, the ceramic heater 10 comprises a substrate 110 made of a ceramic material, such as aluminum nitride (AlN), a heating layer 130 for generating heat, a termination layer 132, a via 134, and a conductive via 140. The via 134 is disposed between the heating layer 130 and the termination layer 132 for connecting the heating layer 130 to the termination layer 132. As shown, the ceramic heater 10 is used as a part of a support pedestal in semiconductor processing. However, it should be understood that the ceramic heater may be employed in other applications, such as by way of example, extruder equipment, injection molding equipment, chemical reactors, among others, while remaining within the scope of the present disclosure.

The substrate 110 defines a first surface 112 for heating a target thereon and a second surface 114 from which terminal wires (FIG. 3) extend. To form a support pedestal, a tubular shaft (FIG. 3) may be bonded to the second surface 114 of the ceramic heater 10 and surround the terminal wires.

The substrate 110 may include a plurality of plate members 122, 124, 126. The plurality of plate members 122, 124, 126 each have a generally flat configuration, and while three plate members 122, 124, and 126 are shown in the illustrative example, the substrate 110 may include any number of plate members. Although in this exemplary form the plate members are flat, it should be understood that the teachings of the present disclosure may be applicable to a variety of geometries, including curved or non-linear geometries while remaining within the scope of the present disclosure. The average surface roughness of adjacent surfaces between the first and second plate members 122, 124 and between the second and third plate members 124, 126 in one form is less than 5 µm, for example between 100 nm and 5 µm. In some forms, the average surface roughness on any one surface is between 100 nm and 1.5 µm, for example between 100 nm and 750 nm or between 100 nm and 500 nm.

The heating layer 130 is embedded within or between the first plate member 122 and the second plate member 124. In some forms of the present disclosure, the heating layer 130 is embedded within the first plate member 122 and/or the second plate member 124. That is, the heating layer 130 may be disposed in the first plate member 122, in the second plate member 124, or in the first plate member 122 and the second plate member 124, while remaining within the scope of the present disclosure.

The termination layer 132 is embedded within the second plate member 124 and/or the third plate member 126. In some forms, the termination layer 132 may be disposed in the second plate member 124 and/or the third plate member 126. That is, the termination layer 132 may be disposed in the second plate member 124, in the third plate member 126, or in the second plate member 124 and the third plate member 126, while remaining within the scope of the present disclosure. In one form of the present disclosure, at least one of the heating layer 130, the termination layer 132, and the via 134 are molybdenum or a molybdenum alloy.

As further shown, the conductive via 140 in one form includes a head 142, a shaft 144, and a cap 146. The cap 146 in one form takes on a nut configuration, and the shaft 144 is threaded inside the via 134, wherein the cap 146 is threaded onto the shaft 144. In at least one form, the head 142, shaft 144, and cap 146 are molybdenum or a molybdenum alloy. Additionally, the head 142, shaft 144, and cap 146 comprise the same or different molybdenum materials. In one form a recess 150 (or cavity) is between the conductive via 140 and the first plate member 122 and/or a space 152 is between conductive via 140 and second plate member 124. It should be understood that such recesses or spaces 150, 152 accommodate thermal expansion between the conductive via 140 and the AlN substrate 110. In another form, a recess or cavity is not present between the conductive via 140 and the first plate member 122 and/or between conductive via 140 and second plate member 124. In such a form, at least a portion of the head 142 is bonded (e.g., brazed or transient liquid phase bonded) to the third plate member 126 and/or at least a portion of the cap 146 is bonded to the first plate member 122.

According to the teachings of the present disclosure, at least one of the heating layer 130 and the termination layer 132 are transient liquid phase (TLP) bonded to at least one of plate members 122, 124, and 126 as described in greater detail below. Also, the conductive via 140 may or may not be transient liquid phase bonded to at least one of the heating layer 130, the termination layer 132, and the plate members 122, 124, 126. In at least one form of the present disclosure, the heating layer 130 is transient liquid phase bonded within the substrate 110 such that the heating layer 130, termination layer 132 and conductive via 140 are hermetically sealed within the substrate 110, thereby eliminating the need for hermetic isolation, which would otherwise be required in certain applications.

The heating layer 130 in one form has a thickness between 5 and 200 µm, for example between 20 µm and 50 µm, between 50 µm and 100 µm, between 100 µm and 150 µm or between 150 µm and 200 µm. The termination layer 132 is generally thicker than the heating layer 130, which results in a lower watt density, to direct greater watt density within the heating layer 130 and to reduce watt density in the termination layer 132.

Referring now to FIGS. 2A-2I, a method of manufacturing ceramic heater 10 according to the teachings of the present disclosure is provided.

Figure 2A:
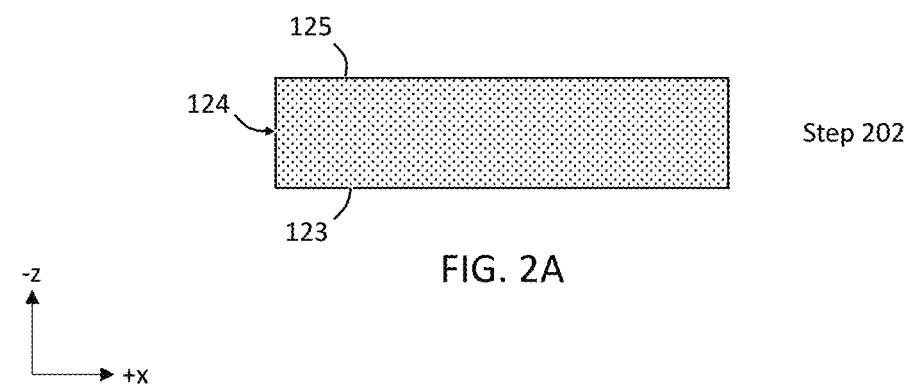

As shown in FIG. 2A, the method includes providing second plate member 124 at step 202. Among other features, the second plate member 124 comprises a first surface 123 disposed opposite a second surface 125.

Figure 2B:
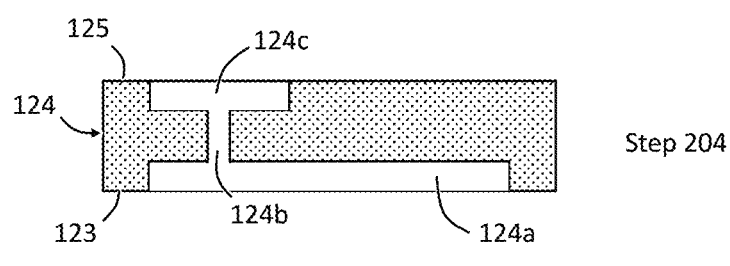

As shown in FIG. 2B, at least one first trench 124a, via 124b, and second trench 124c are formed in the second plate member 124 at step 204. The first trench 124a is formed in the first surface 123 and the second trench 124c is formed in the second surface 125. That is, the first trench 124a extends from the first surface 123 towards (+z direction) the second surface 125 and the second trench 124c extends from the second surface 125 towards (−z direction) the first surface 123. The via 124b extends between the first trench 124a and the second trench 124c. It should be understood that the first trench 124a, second trench 124c and via 124b, and other trenches and vias disclosed herein, can be formed using any known or yet to be developed material removal technique. Non-limiting examples of material removal techniques include grinding, laser cutting, etching, machining, photolithography, and sand or grit blasting, among others.

Figure 2C:
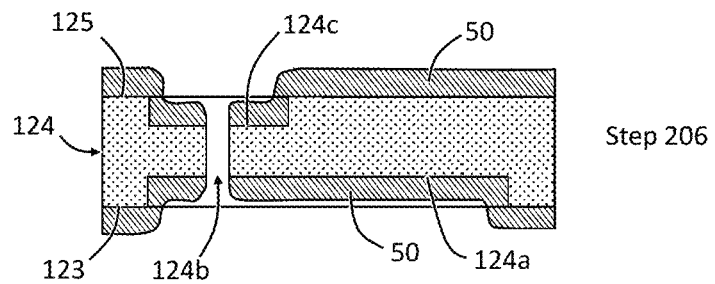

As shown in FIG. 2C, at least one molybdenum (Mo) layer 50 is deposited on or within the first surface 123, the first trench 124a, the second trench 124c, and the second surface 125 at step 206. While not shown in FIG. 2C, the molybdenum layer 50 can be deposited at least partially in via 124b. It should be understood that the molybdenum layer 50, and other layers disclosed herein, can be deposited using any known or yet to be developed material layer deposition technique(s). Non-limiting examples of material layer deposition techniques include cathodic arc discharge, cold spray, chemical vapor deposition (CVD) techniques, physical vapor deposition (PVD) techniques, sol-gel techniques, sputtering, and vacuum plasma spray, among others.

Figure 2D:
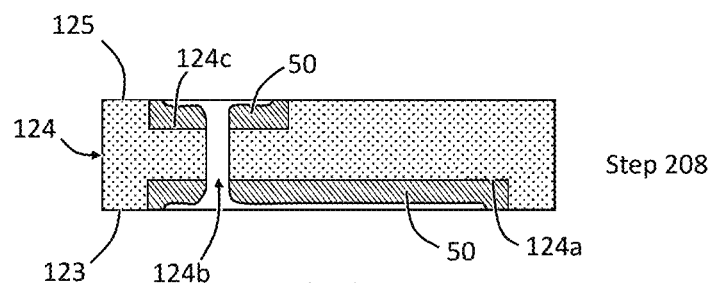

As shown in FIG. 2D, at least a portion or thickness (z direction) of the molybdenum layer 50 extending over or deposited onto the first surface 123 and the second surface 125 is removed at step 208. In some forms, the molybdenum layer 50 is substantially removed from the first surface 123 and the second surface 125. However, and as shown in the figure, the molybdenum layer 50 remains in the first trench 124a and the second trench 124c. In one form of the present disclosure an average surface roughness of the second plate member 124 after the molybdenum layer 50 is removed from the first surface 123 and the second surface 125 is less than 5 µm, for example between 100 nm and. It should be understood that the molybdenum layer 50, and other layers disclosed herein, can be removed using any known or yet to be developed layer removal technique. Non-limiting examples of layer removal techniques include lapping, polishing, and chemical mechanical polishing (CMP), among others.

Figure 2E:
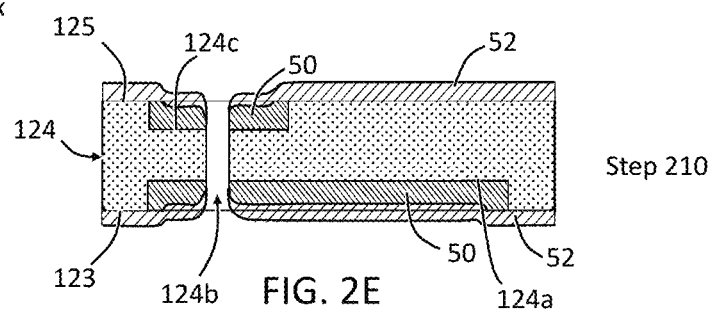

As shown in FIG. 2E, at least one silicon (Si) layer 52 is deposited on the molybdenum layer 50 disposed within the first and second trenches 124a, 124c, and on the first surface 123 and the second surface 125 at step 210. While not shown, the silicon layer 52 can be deposited at least partially in via 124b.

Figure 2F:
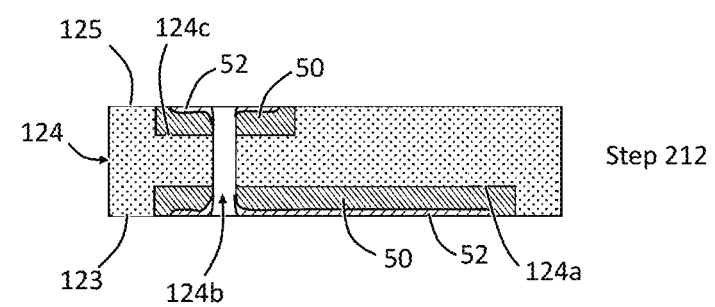

As shown in FIG. 2F, at least a portion or thickness (z direction) of the silicon layer 52 extending over or deposited onto the first surface 123 and the second surface 125 is removed at step 212. In some forms, the silicon layer 52 is substantially removed from the first surface 123 and the second surface 125. However, and as shown in the figure, the silicon layer 52 remains over the molybdenum layer 50 disposed in the first trench 124a and the second trench 124c. Accordingly, a molybdenum layer 50 with a thin silicon layer 52 disposed thereon is provided in the first trench 124a and the second trench 124c. Non-limiting examples of the thickness of the molybdenum layer 50 range from 5 µm to 200 µm, for example between 10 µm to 40 µm. Non-limiting examples of the thickness of the silicon layer 52 range from 100 nm to 10 µm, for example between 0.5 µm to 3 µm. In some aspects of the present disclosure an average surface roughness of the second plate member 124 after the silicon layer 52 is removed from the first surface 123 and the second surface 125 is less than 5 µm, for example between 100 nm and 5 µm.

In variations of the present disclosure, step 208 is combined with step 212. That is, the molybdenum layer 50 is deposited at step 206, step 208 is omitted, the silicon layer 52 is deposited onto the molybdenum layer 50 at step 210, and the molybdenum layer 50 and the silicon layer 52 extending over or deposited onto the first surface 123 and the second surface 125 are removed at step 212.

Figure 2G:
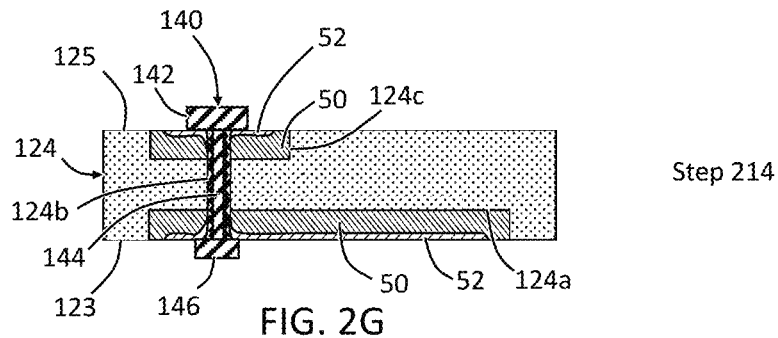

As shown in FIG. 2G, the shaft 144 of the conductive via 140 is positioned within the via 124b at step 214. The head 142 is disposed over and in contact with the silicon layer 52 deposited over the molybdenum layer 50 in the second trench 124c and the cap 146 is disposed over and in contact with the silicon layer 52 deposited over the molybdenum layer 50 in the first trench 124a.

Figure 2H:
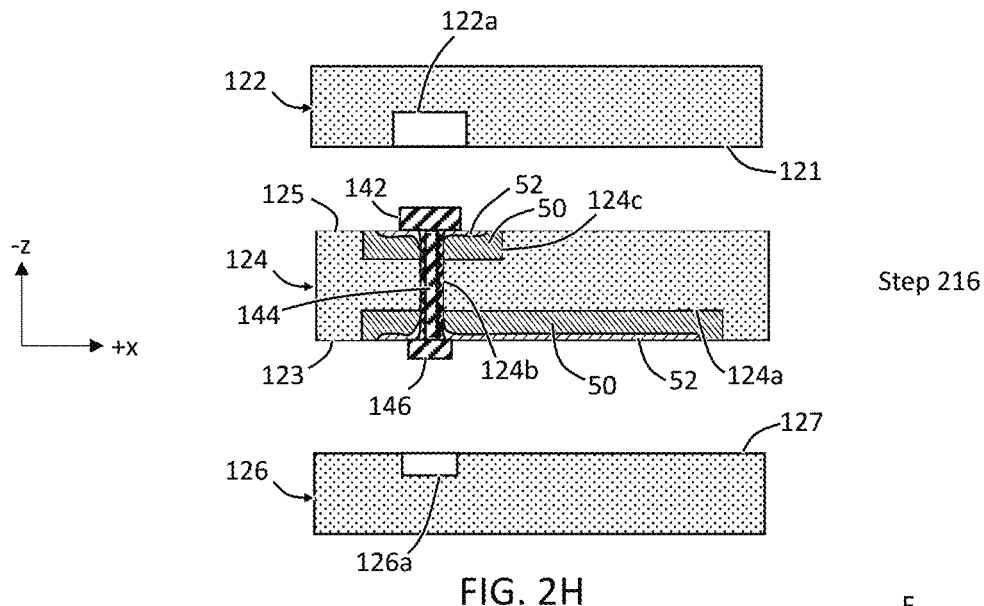

As shown in FIG. 2H, the first plate member 122 and the third plate member 126 are provided at step 216. In some aspects of the present disclosure, the first plate member 122 comprises an inner surface 121 and a trench 122a formed within the inner surface 121, and the third plate member 126 comprises an inner surface 127 and a trench 126a formed within the inner surface 127. Also, the first plate member 122, second plate member 124, and third plate member 126 are assembled such that the trench 122a is disposed over (+z direction) and aligned with the head 142 of the conductive via 140 and the trench 126a is disposed under (−z direction) and aligned with the cap 146 of the conductive via 140.

Figure 2I:
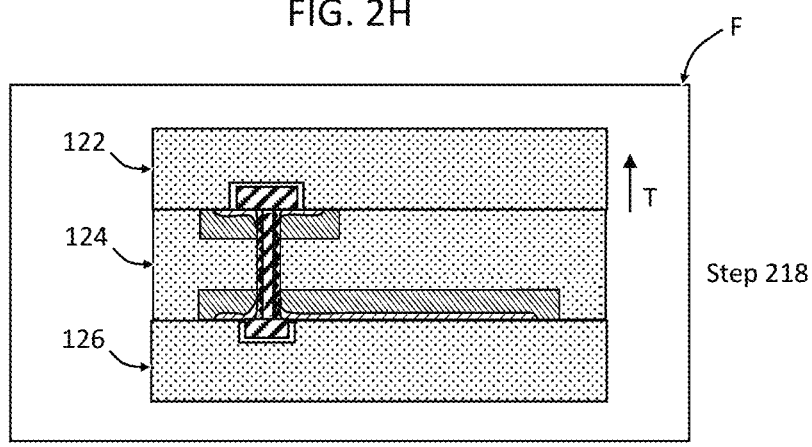

Referring now to FIG. 2I, the first plate member 122, second plate member 124, and third plate member 126 are positioned in contact with each other at step 218 and heated to an elevated temperature such that the silicon layers 52 melt and a transient liquid phase bond is formed between the plate members 122, 124, 126 to produce the ceramic heater 10 of FIG. 1. For example, the assembly of the first plate member 122, second plate member 124, third plate member 126 and conductive via 140 depicted in FIG. 2I can be placed in a furnace 'F' and heated to above the melting temperature of silicon (1414° C.). The silicon in the silicon layers 52 melts and diffuses into adjacent molybdenum layers 50 and adjacent plate members 122, 126, and a transient liquid phase bond is formed therebetween. Particularly, the silicon layer 52 disposed over the molybdenum layer 50 in the first trench 124a melts and diffuses into the molybdenum layer 50 and the overlapping inner surface 127 of the third plate member 126 such that a transient liquid phase bond is formed between the molybdenum layer 50 and the third plate member 126. Also, the silicon layer 52 disposed over the molybdenum layer 50 in the second trench 124c melts and diffuses into the molybdenum layer 50 and the overlapping inner surface 121 of the first plate member 226 such that a transient liquid phase bond is formed between the molybdenum layer 50 and the third plate member 126. In some forms of the present disclosure, the silicon layer 52 disposed over the molybdenum layer 50 in the first trench 124a melts and diffuses into the cap 146 of the conductive via 140 and the silicon layer 52 disposed over the molybdenum layer 50 in the second trench 124c melts and diffuses into the head 142 of the conductive via 140 such that transient liquid phase bonds are formed therebetween.

Not being bound by theory, it should be understood that diffusion of the silicon into the molybdenum layers 50 results in the formation of a Mo—Si diffusion layer which may or may not comprise a Mo—Si alloy or Mo—Si intermetallic. For example, diffusion of the silicon into the molybdenum layers 50 can result in the formation of a transient liquid phase bond with a molybdenum disilicide (MoSi$_2$) layer or a Mo—Si diffusion layer comprising MoSi$_2$ precipitates. Also, diffusion of the silicon into the inner surfaces 121, 127 of the first plate member 122 and the third plate member 126, respectively, results in the formation of an AlN—Si diffusion layer which may or may not comprise an Al—Si alloy, Al—Si intermetallic and/or AlN—Si intermetallic. It should also be understood that diffusion of the silicon into the molybdenum layers 50 and adjacent inner surfaces 121, 127 results in isothermal solidification of the silicon, e.g., when MoSi$_2$ precipitates form and a bonding interface (i.e., a transient liquid phase bond) is created between the molybdenum layers 50 and adjacent inner surfaces 121, 127. In this manner the plate members 122, 124, 126 are bonded together to form the substrate 110 with the molybdenum heating layer 130 and the molybdenum termination layer 132. p While FIGS. 2A-2I depict transient liquid phase bonding of the plate members 122, 124, 126 together, it should be understood that brazing of portions of the ceramic heater 10 can be included. For example, outer diameter surfaces of the plate members 122, 124, and/or 126 can be brazed together to seal the outer diameter of the substrate 110 and thereby prevent leaks or outgassing vapors from the heater heating layer 130, termination layer 132 and conductive via 140 into a semiconductor wafer processing chamber during use of the ceramic heater 10. In a form, trenches can be formed in one or more of the plate members 122, 124, 126 in order to contain flow of a brazing alloy outside of a desired braze area and reduce the desired braze area.

Figure 3:
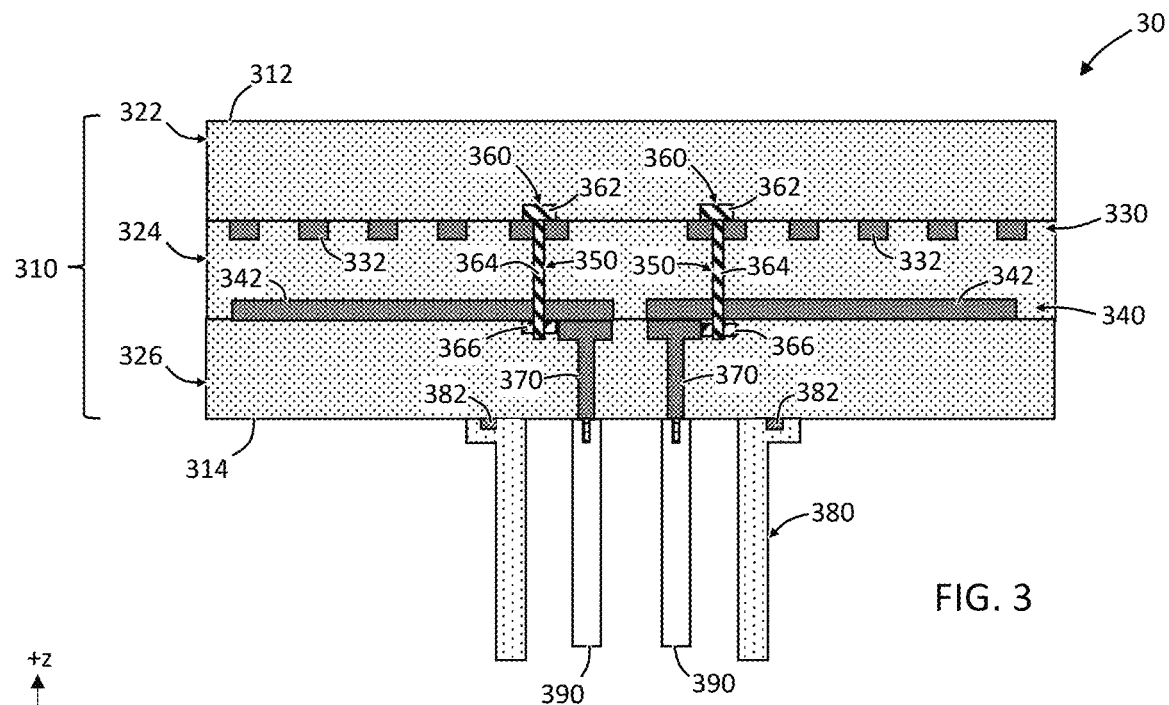
FIG. 3 is a cross-sectional view of another ceramic heater constructed in accordance with the teachings of the present disclosure.

Now referring to FIG. 3, in another from of the present disclosure a ceramic heater 30 constructed in accordance with the teachings of the present disclosure is shown. The ceramic heater 30 comprises a substrate 310 made of ceramic materials, such as aluminum nitride (AlN), a heating layer 330 for generating heat, a routing layer 340, one or more first conductive vias 350, one or more second conductive vias 370, and a substrate shaft 380. The first conductive vias 350 are disposed between the heating layer 330 and the routing layer 340 for connecting the heating layer 330 to the routing layer 340, and the second conductive vias 370 are disposed between the routing layer 340 and at least one terminal wire 390. The ceramic heater 30 may be used as a part of a support pedestal in semiconductor processing.

The substrate 310 defines a first surface 312 for heating a target thereon and a second surface 314 from which the at least one terminal wire 390 extends. To form a support pedestal, the substrate shaft 380 is bonded to the second surface 314 of the substrate 310 via a bonding layer 382 (e.g., a transient liquid phase binding layer) and surrounds the at least one terminal wire 390. The substrate 310 may include a plurality of plate members 322, 324, 326. The plurality of plate members 322, 324, 326 each have a flat plate configuration, and while three plate members 322, 324, and 326 are shown in the illustrative example, the substrate 310 may include any number of plate members. The average surface roughness of adjacent surfaces between the first and second plate members 322, 324 and between the second and third plate members 324, 326 is less than 5 μm, for example between 100 nm and 5 μm.

The heating layer 330 is embedded within the first plate member 322 and/or the second plate member 324. In some forms of the present disclosure, the heating layer 330 is disposed in the first plate member 322 and/or the second plate member 324. That is, the heating layer 330 may be disposed in the first plate member 322, the second plate member 324, or the first plate member 322 and the second plate member 324, while remaining within the scope of the present disclosure. The routing layer 340 is embedded within the second plate member 324 and/or the third plate member 326. In some forms, the routing layer 340 may be disposed on or partially in the second plate member 324 and/or the third plate member 326. That is, the routing layer 340 may be disposed in the second plate member 324, the third plate member 326, or the second plate member 324 and the third plate member 326, while remaining within the scope of the present disclosure. At least one of the first conductive vias 350 within the second plate member 324 between heating layer 330 and the routing layer 340 and/or at least one of the second conductive vias 370 within the third plate member 326 may be a trench (not shown) along a side of second plate member 324 or third plate member 326, respectively. In some forms of the present disclosure, at least one of the heating layer 330, the routing layer 340, first conductive vias 350 and second conductive vias 370 are molybdenum or a molybdenum alloy.

In one form of the present disclosure, the heating layer 330 includes at least one heating element 332 and the routing layer 340 includes a plurality of routing layer elements 342. For example, the heating layer 330 can include a plurality of circular-arranged heating elements 332 and/or a plurality of serpentine-arranged heating elements 332, among others. Also, the heating layer 330 can define a plurality of distinct and independently controlled heating zones as discussed in greater detail below.

In some forms of the present disclosure, the first conductive vias 350 include a fastener 360 that comprise a head 362, a shaft 364, and a cap 366. In such forms, the fasteners 360 extend through the second plate member 324 and in at least one aspect, the head 362, shaft 364, and cap 366 are molybdenum or a molybdenum alloy. The second conductive vias 370 may include fasteners (not shown). In the alternative, or in addition to, the first conductive vias 350 and/or the second conductive vias 370 may be formed from a rod, pin, shaft, among others, disposed in the second plate member 324 and the third plate member 326, respectively.

It should be understood that the substrate 310 is manufactured using transient liquid phase bonding as described above with respect to substrate 110. For example, in one form of the present disclosure trenches and vias (not labeled) are formed in the second plate member 324, and molybdenum layers are deposited in the trenches and removed from outer surfaces of the second plate member 324. Silicon layers are deposited onto the molybdenum layers in the trenches and removed from outer surfaces of the second plate member 322, and the conductive vias 370 are inserted through the vias in the second plate member 324. Trenches and vias (not labeled) are formed in the third plate member 326, and the plate members 322, 324, 326 are assembled and transient liquid phase bonded together. Also, trenches (not labeled) are formed in the substrate shaft 380 and Mo—Si bonding layers are deposited into the trenches such that the substrate shaft 380 is assembled and transient liquid phase bonded to the third plate member before, during or after transient liquid phase bonding of the plate members 322, 324, 326 together.

Figure 4:
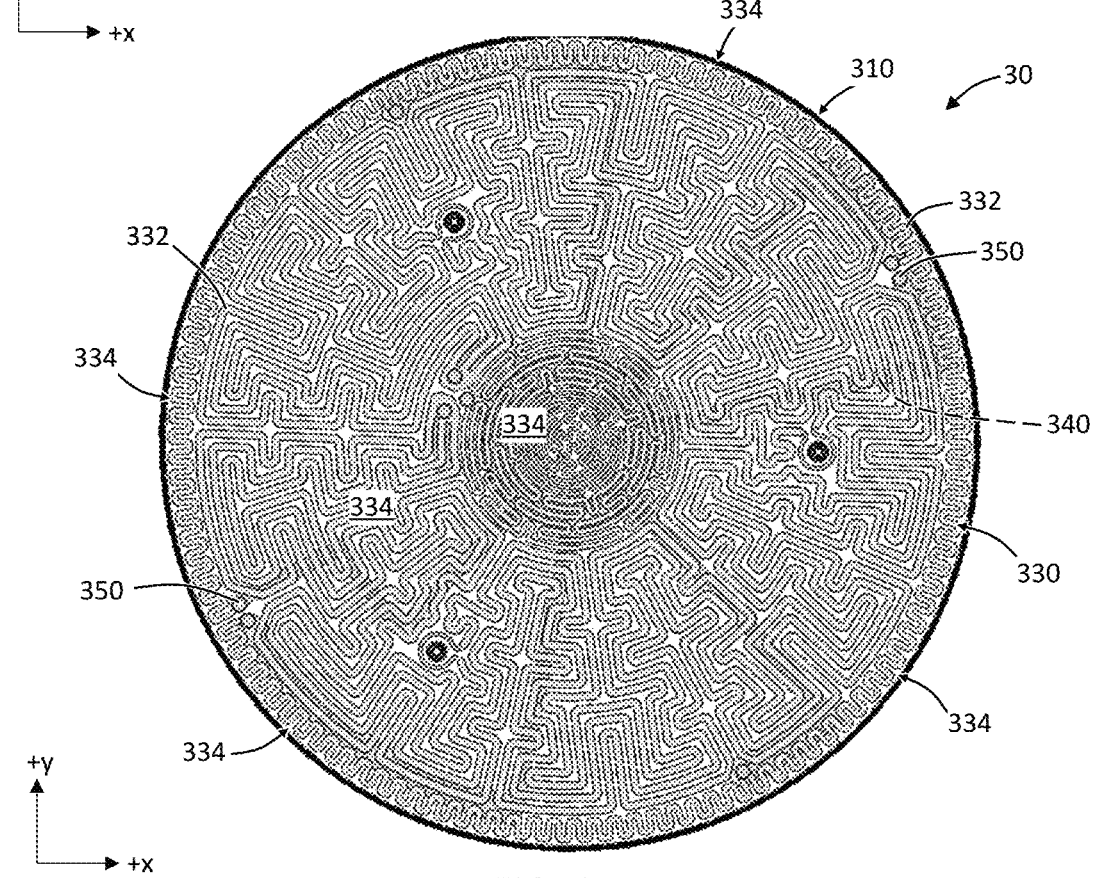
FIG. 4 is a top view of the ceramic heater in FIG. 3 with a first configuration of heating zones.

Referring now to FIG. 4, a top view (−z direction) of the ceramic heater 30 according to one form of the present disclosure is shown. The first plate member 322 is not shown in FIG. 4 in order to show the heating layer 330 in greater detail. The ceramic heater 30 shown in FIG. 4 includes a plurality of molybdenum heating elements 332, a plurality of routing layers 340, and a plurality of conductive vias 350 extending between and electrically connecting the plurality of molybdenum heating elements to the plurality of routing layers 340. Also, the ceramic heater 30 shown in FIG. 4 includes six (6) distinct and independently controlled heat zones 334.

Figure 5:
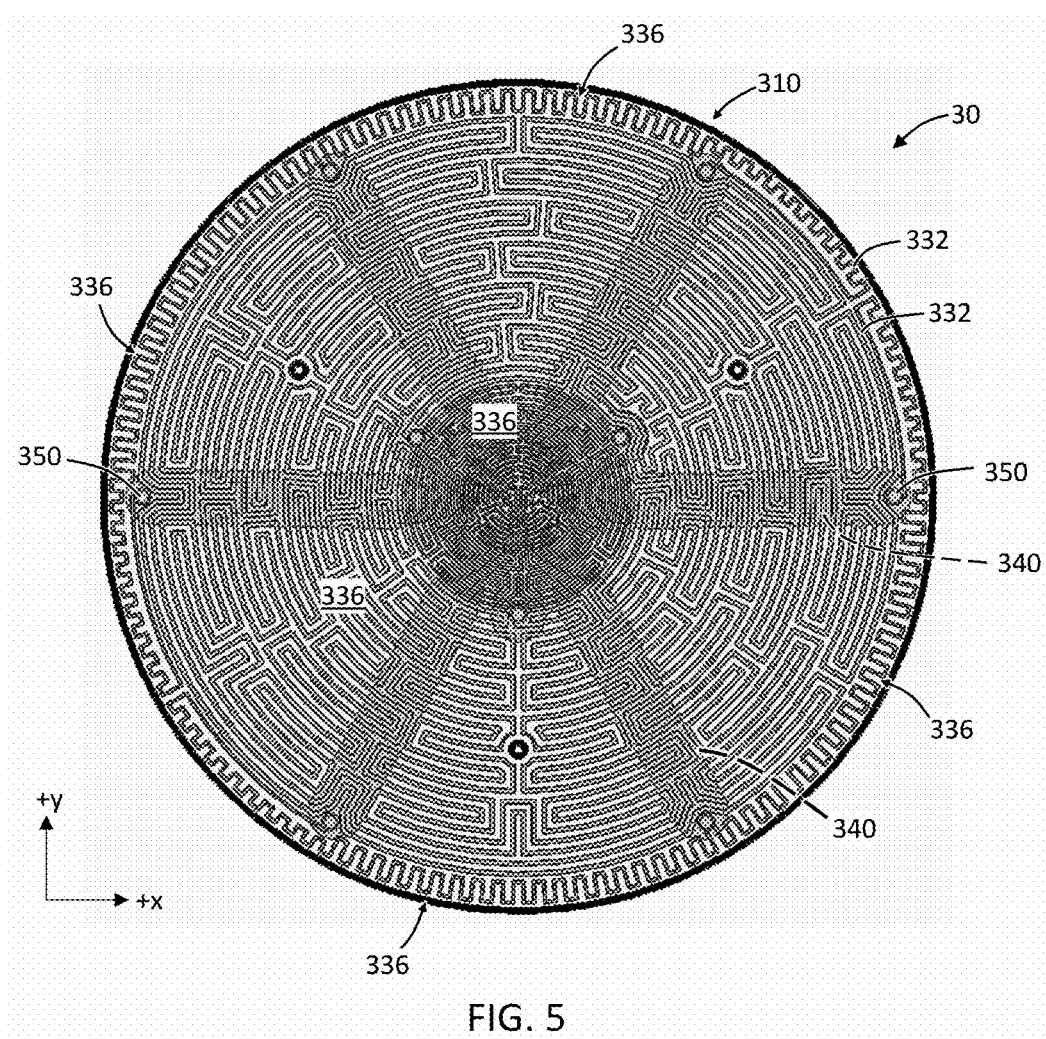
FIG. 5 is a top view of the ceramic heater in FIG. 3 with a second configuration of heating zones.

Referring now to FIG. 5, a top view (−z direction) of the ceramic heater 30 (without the first plate member 322) according to another form of the present disclosure is shown. Similar to the ceramic heater 30 shown in FIG. 4, the ceramic heater 30 shown in FIG. 5 includes a plurality of molybdenum heating elements 332, a plurality of routing layers 340, and a plurality of conductive vias 350 extending between and electrically connecting the plurality of molybdenum heating elements to the plurality of routing layers 340. Also, the ceramic heater 30 shown in FIG. 5 includes six (6) distinct and independently controlled heat zones 336.

Figure 6:
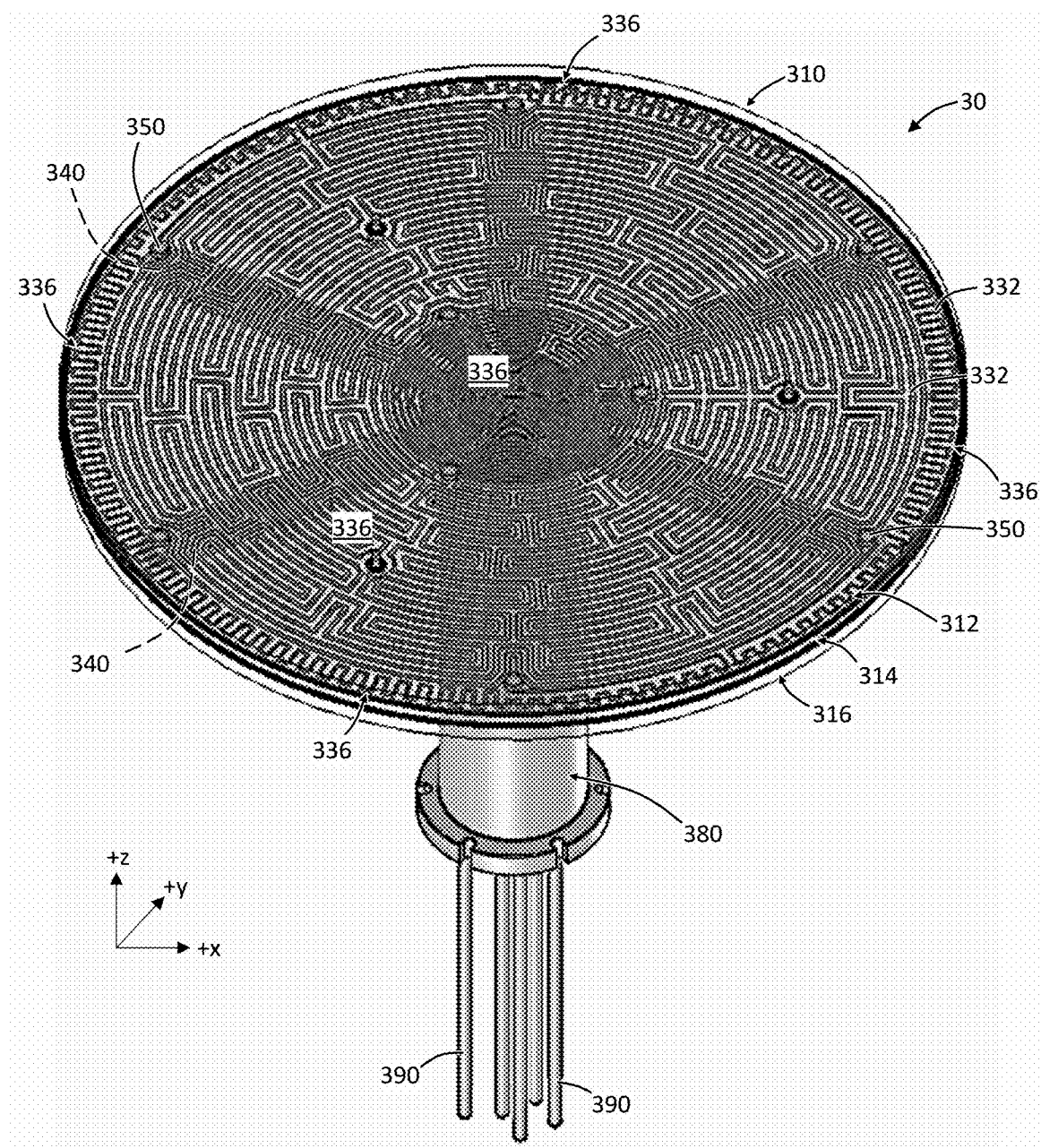
FIG. 6 is a perspective view of the ceramic heater of FIG. 5.

Referring now to FIG. 6, a perspective view of the ceramic heater in FIG. 5 is shown with the six heat zones 336, substrate shaft 380 and terminal wires 390.

While the figures have generally been described with Mo—Si layers or compositions being used to transient liquid phase bond the plate members together, it should be understood that the teachings of the present disclosure include other compositions to transient liquid phase bond the plate members together. Non-limiting examples of compositions that can be used to transient liquid phase bond plate members together as described herein include titanium-aluminum layers, palladium-aluminum layers, manganese-aluminum layers, niobium-silicon layers, and tungsten-silicon layers, among others.

When an element or layer is referred to as being "on," "engaged to," or "coupled to," another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in like fashion (e.g., "between" versus "directly between," "adjacent" versus "directly adjacent," etc.). As used herein, the term "and/or" includes any and all combinations of one or more of the associated listed items.

Although the terms first, second, third, etc. may be used to describe various elements, components, regions, layers and/or sections, these elements, components, regions, layers and/or sections, should not be limited by these terms. These terms may be only used to distinguish one element, component, region, layer and/or section, from another element, component, region, layer and/or section. Terms such as "first," "second," and other numerical terms when used herein do not imply a sequence or order unless clearly indicated by the context. Thus, a first element, component, region, layer or section, could be termed a second element, component, region, layer or section without departing from the teachings of the example forms. Furthermore, an element, component, region, layer or section may be termed a "second" element, component, region, layer or section, without the need for an element, component, region, layer or section termed a "first" element, component, region, layer or section.

Spacially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above or below. The device may be otherwise oriented (rotated 90 degrees or at other orientations) and the spatially relative descriptors used herein interpreted accordingly.

As used herein, the phrase at least one of A, B, and C should be construed to mean a logical (A OR B OR C), using a non-exclusive logical OR, and should not be construed to mean "at least one of A, at least one of B, and at least one of C.

Unless otherwise expressly indicated, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

The terminology used herein is for the purpose of describing particular example forms only and is not intended to be limiting. The singular forms "a," "an," and "the" may be intended to include the plural forms as well, unless the context clearly indicates otherwise. The terms "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, examples that do not depart from the substance of the disclosure are intended to be within the scope of the disclosure. Such examples are not to be regarded as a departure from the spirit and scope of the disclosure. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. A heater comprising:
   a ceramic substrate;
   a heating layer, wherein the heating layer is bonded to the ceramic substrate via transient liquid phase bonding;
   a routing layer, wherein the routing layer extends radially between a central portion of the ceramic substrate and an outer portion of the ceramic substrate, and wherein the routing layer is disposed within the ceramic substrate; a plurality of first conductive vias connecting the heating layer to the routing layer; and
   a plurality of second conductive vias connecting the routing layer to at least one terminal wire, the terminal wire being disposed proximate the central portion of the ceramic substrate,
   wherein the routing layer is bonded to the ceramic substrate via transient liquid phase bonding.

2. The heater according to claim 1, wherein the ceramic substrate is an aluminum nitride (AlN) substrate, the plurality of first conductive vias are made from a molybdenum material, and the plurality of first conductive vias are bonded to the AlN substrate via transient liquid phase bonding.

3. The heater according to claim 2, wherein the AlN substrate includes a plurality of plate members that are bonded together with the molybdenum material via transient liquid phase bonding.

4. The heater according to claim 3, wherein the plurality of plate members includes a first plate member and a second plate member through which the plurality of first conductive vias made of the molybdenum material extend.

5. The heater according to claim 4, wherein the heating layer is embedded within at least one of the first plate member and the second plate member.

6. The heater according to claim 4, wherein an average surface roughness between the first plate member and the second plate member is less than 5 μm.

7. The heater according to claim 4, wherein the routing layer is made of the molybdenum material and is embedded within at least one of the second plate member and a third plate member and in contact with the plurality of first conductive vias.

8. The heater according to claim 7 further comprising a termination layer made of the molybdenum material and in electrical communication with the heating layer, wherein the termination layer is bonded to the third plate member via transient liquid phase bonding.

9. The heater according to claim 3, wherein the plurality of plate members includes a first plate member, a second plate member through which the plurality of first conductive vias made of the molybdenum material extend, and a third plate member through which a plurality of second conductive vias made of the molybdenum material extend.

10. The heater according to claim 9, wherein the heating layer is embedded within at least one of the first plate member and the second plate member.

11. The heater according to claim 9 further comprising a termination layer made of the molybdenum material embedded within at least one of the second plate member and the third plate member.

12. The heater according to claim 9, wherein the molybdenum material comprises molybdenum and silicon before the transient liquid phase bonding.

13. The heater according to claim 12 further comprising at least one of a molybdenum-silicon (Mo—Si) alloy and a Mo—Si intermetallic between the heating layer and the AlN substrate.

14. A heater comprising:
   an aluminum nitride (AlN) substrate comprising a plurality of plate members; and
   a heating layer disposed in the AlN substrate, wherein the plurality of plate members are bonded together via transient liquid phase bonding between the plurality of plate members;
   a routing layer, wherein the routing layer extends radially between a central portion of the AlN substrate and an outer portion of the AlN substrate, and wherein the routing layer is disposed within the AlN substrate;
   a plurality of first conductive vias connecting the heating layer to the routing layer, wherein at least one of the routing layer and the plurality of first conductive vias are bonded to the AlN substrate via transient liquid phase bonding; and
   a plurality of second conductive vias connecting the routing layer to at least one terminal wire.

15. The heater according to claim 14, wherein at least one of the heating layer, the routing layer, and the plurality of first conductive vias is made from a molybdenum material, and wherein the molybdenum material comprises molybdenum and silicon.

16. The heater according to claim 15, wherein the transient liquid phase bond comprises at least one of a molybdenum-silicon (Mo—Si) alloy and a Mo—Si intermetallic.

17. The heater according to claim 14, wherein the plurality of plate members includes a first plate member, a second plate member through which the plurality of first conductive vias extend, and a third plate member through which the plurality of second conductive vias extend.

18. The heater according to claim 17, wherein the heating layer is embedded within at least one of the first plate member and the second plate member.

19. The heater according to claim 17, wherein the heating layer is bonded to the first plate member via transient liquid phase bonding.

20. The heater according to claim 17, wherein the routing layer is embedded within at least one of the second plate member and the third plate member.

21. The heater according to claim 20, wherein the routing layer is bonded to the third plate member via transient liquid phase bonding.

\* \* \* \* \*